(12) United States Patent
Zheng et al.

(10) Patent No.: US 12,738,959 B2
(45) Date of Patent: Sep. 15, 2026

(54) ELECTRONIC DEVICE WITH PLUGGABLE FRONT END MODULE

(71) Applicant: HEWLETT PACKARD ENTERPRISE DEVELOPMENT LP, Spring, TX (US)

(72) Inventors: Jiguang Zheng, Beijing (CN); Kuanyue Li, Beijing (CN); Hailong Bai, Beijing (CN)

(73) Assignee: Hewlett Packard Enterprise Development LP, Spring, TX (US)

( * ) Notice: Subject to any disclaimer, the term of this patent is extended or adjusted under 35 U.S.C. 154(b) by 360 days.

(21) Appl. No.: 18/460,812

(22) Filed: Sep. 5, 2023

(65) Prior Publication Data

US 2025/0080139 A1 Mar. 6, 2025

(51) Int. Cl.
*H04B 1/00* (2006.01)
*H05K 7/10* (2006.01)
*H05K 9/00* (2006.01)

(52) U.S. Cl.
CPC ............ *H04B 1/0053* (2013.01); *H05K 7/10* (2013.01); *H05K 9/006* (2013.01)

(58) Field of Classification Search
CPC .. E01D 15/133; B61H 13/24; B65H 35/0066; C01G 19/02; C01P 2004/03; F16K 99/0001; F24B 5/06; F24H 3/00; G04B 21/02; G05D 7/0635; Y10T 137/0318; Y10T 137/538; Y10T 137/5403; Y10T 137/5497; Y10T 137/5509; Y10T 137/87169; Y10T 83/4516; H04B 1/0053; H05K 7/10; H05K 9/006
See application file for complete search history.

(56) References Cited

U.S. PATENT DOCUMENTS

| | | | |
|---|---|---|---|
| 7,149,397 | B2 | 12/2006 | Popovic et al. |
| 7,620,754 | B2 | 11/2009 | Yee et al. |
| 8,566,643 | B2 | 10/2013 | Miller |
| 8,708,577 | B2 | 4/2014 | Chan et al. |

(Continued)

FOREIGN PATENT DOCUMENTS

| | | | | |
|---|---|---|---|---|
| WO | WO-2020177917 A1 * | 9/2020 | ............ | H04B 10/40 |
| WO | 2021/156147 A1 | 8/2021 | | |

*Primary Examiner* — Nguyen T Vo
(74) *Attorney, Agent, or Firm* — Hewlett Packard Enterprise Patent Department

(57) ABSTRACT

Implementations of the present disclosure relate to an electronic device with a pluggable front end module. The electronic device comprises a housing comprising a plurality of small form-factor pluggable (SFP) ports for receiving a plurality of pluggable modules and the plurality of pluggable modules comprising at least one SFP module and at least one pluggable front end module (FEM). The electronic device further comprises a first circuit unit provided inside the housing and a second circuit unit provided inside the housing. The electronic device further comprises a multiplex unit provided inside the housing, and the multiplex unit is configured to enable communications between the pluggable FEM and the first circuit unit, and enable communications between the SFP module and the second circuit unit. By implementing pluggable FEM and inserting the pluggable FEM into an SFP port, implementations of the present disclosure can be more flexible, replaceable and modular.

11 Claims, 6 Drawing Sheets

(56) References Cited

U.S. PATENT DOCUMENTS

| | | | | |
|---|---|---|---|---|
| 9,104,897 | B2 | 8/2015 | Chen et al. | |
| 9,866,257 | B2 | 1/2018 | Huang et al. | |
| 10,419,227 | B2 | 9/2019 | Large et al. | |
| 11,967,994 | B1 * | 4/2024 | Saghari | H04J 14/0227 |
| 2007/0180145 | A1 | 8/2007 | Scheibe | |
| 2016/0099800 | A1 * | 4/2016 | Park | H04B 1/44<br>370/275 |
| 2017/0364295 | A1 | 12/2017 | Sardinha et al. | |
| 2020/0328729 | A1 * | 10/2020 | Jo | H03H 11/28 |
| 2022/0283054 | A1 * | 9/2022 | Iwasaki | G01M 11/33 |
| 2023/0305249 | A1 * | 9/2023 | Hemp | G02B 6/4284 |

* cited by examiner

ELECTRONIC DEVICE WITH PLUGGABLE FRONT END MODULE

BACKGROUND

As the frequency bands expand to 2.4G, 5G, and 6G and the data streams increase to 4×4 for a Wi-Fi device, the quantity of front end modules (FEMs) on a single main board is increasing dramatically. In one instance, taking the three frequency bands (for example, 2.4G, 5G, and 6G) for the 4×4 (4×4 MIMO, Multiple Input Multiple Output) access point (AP) as an example, there is a total of 12 FEMs to be installed on the single main board. That is to say, for the Wi-Fi products, the FEM may be divided into 2.4G FEM, 5G FEM, and 6G FEM, which are applied to 2.4G, 5G, and 6G frequency bands, respectively. For example, among the 12 FEMs, a first set of four FEMs are designed for the frequency band 2.4G, a second set of four FEMs are designed for the frequency band 5G, and the remaining four FEMs are designed for the frequency 6G.

The FEM in the hardware circuit achieves the transmission amplification of the RF signal and accepts the amplification, and acts in a role of power detection, controlling, and switching. The FEM comprises a transceiver for transmitting and receiving signals with a frequency band, and there will be a challenge when installing, replacing, and designing a large number of FEMs on the main board.

BRIEF DESCRIPTION OF THE DRAWINGS

Through the following detailed descriptions with reference to the accompanying drawings, the above and other objectives, features, and advantages of the example implementations disclosed herein will become more comprehensible. In the drawings, several example implementations disclosed herein will be illustrated in an example and in a non-limiting manner, where.

DETAILED DESCRIPTION

Figure 1:
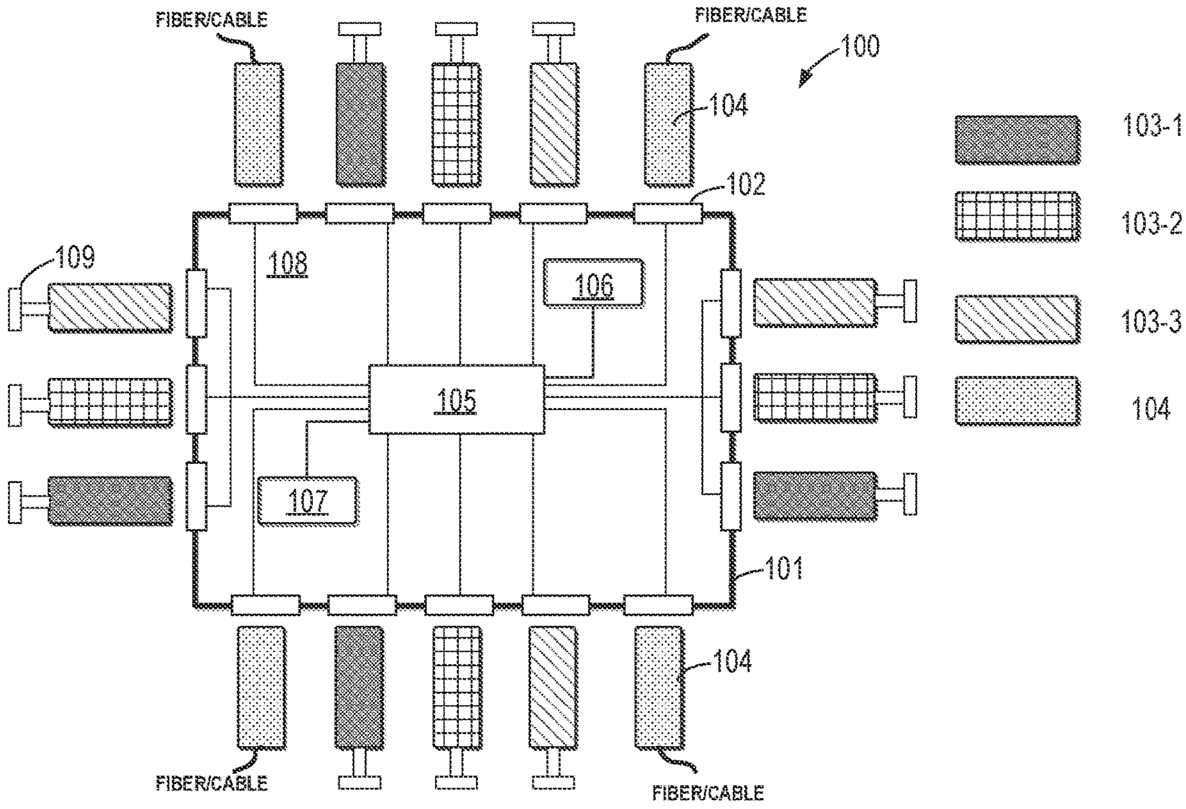
FIG. 1 illustrates a block diagram of an electronic device in accordance with some example implementations of the present disclosure.

Traditionally, the front end modules (FEMs) are mounted inside a housing of an electronic device, such as an access point (AP). As mentioned above, if three frequency bands (for example, 2.4G, 5G, and 6G) are designed for the 4×4 MIMO AP, a total of 12 FEMs is needed. There may not be enough room to provide these FEMs inside the housing of the AP, for example, on a single main board. Even though these FEMs are provided on the single main board, it may take a lot of manpower and material resources to design and install these FEMs when manufacturing the FEMs, thereby rendering high costs.

Further, the FEMs are touchy modules, and their failure rates are higher than other components in the AP, and it may need to replace the failed FEMs frequently. Since the FEMs are provided inside the housing, the replacement and maintenance may be time-consuming and labor-intensive work. Sometimes, in the case of FEM failure, the whole main board needs to be replaced, thereby rendering a high cost.

Due to the short distance between two adjacent FEMs for the same frequency band provided on the single main board and the electromagnetic interference between them, the radio performance of these two adjacent FEMs may deteriorate significantly. Further, these FEMs may produce plenty of heat when transmitting and receiving signals, and heat sinks are desired to be provided near the FEMs. Due to little room inside the housing, it may not be possible to provide a heat sink for each FEM, and several FEMs may share a common heat sink. If the heat cannot be dissipated timely, it may cause failure to the FEMs over time.

In view of the above, there is a need to make FEM more flexible, replaceable, and modular. For example, when a failure is caused to the FEM, there is a need to replace the failed FEM efficiently. When designing the FEM circuitry, high flexibility may need such that the FEM circuitry may be isolated from other circuitries on the main board, and a modular operation can be performed for the FEM.

Example implementations of the present disclosure propose a solution for providing an electronic device having pluggable FEM(s). The electronic device comprises a housing comprising a plurality of small form-factor pluggable (SFP) ports for receiving a plurality of pluggable modules, and the plurality of pluggable modules comprises at least one SFP module and at least one pluggable front end module (FEM). The electronic device further comprises a first circuit unit provided inside the housing, and a second circuit unit provided inside the housing. The electronic device further comprises a multiplex unit provided inside the housing, and the multiplex unit is configured to enable communications between the pluggable FEM and the first circuit unit, and enable communications between the SFP module and the second circuit unit. As for the pluggable FEM, it integrates FEM into an SFP module, such that the FEM may be implemented by an SFP module and may be inserted into an SFP port outside the housing, and thus there is no necessary to provide a large number of FEM inside the housing, such as on the main board.

According to implementations of the present disclosure, by providing a multiplex unit for connecting an inserted module to a first or second circuit unit based on the type of the inserted module, different types of modules, such as a pluggable FEM (i.e., a modified SFP module having the FEM) and an original SFP Module, can be inserted into the port of same type and communicates with respective circuit units on the main board to achieve different functions. Therefore, by implementing the FEM in the SFP module to achieve a pluggable FEM outside the housing of the electronic device, the touchy FEM can be easily mounted and replaced in the case of failure. Moreover, since a long distance can be provided between respective SFP ports of the pluggable FEMs for the same frequency band outside the housing, enhanced radio performance for the FEM can be achieved.

FIG. 1 illustrates a block diagram of an electronic device 100 in accordance with some example implementations of the present disclosure. In one example, the electronic device 100 may be an access point (AP). In other examples, the electronic device 100 may be any other device that may use a FEM. The AP is a networking device that allows wireless-capable devices to connect to a wired network. With the development of wireless communication technology, the AP is provided with a multiple input multiple output (MIMO) system, so as to improve the transmission rate and bandwidth utilization of information. Corresponding, the AP is provided with a plurality of front-end modules (FEMs). Communications between the AP and the wireless-capable devices may operate according to wireless communication protocols such as the Institute of Electrical and Electronic Engineers (IEEE) 802.11 standards, Wi-Fi Alliance Specifications, or any other wireless communication standards. The IEEE 802.11 standards may include the IEEE 802.11 ay standard (e.g., operating at 60 GHz), the IEEE 802.11ad standard (sometimes referred to as "WiGig"), the IEEE 802.11be (referred to as "Wi-Fi 7") or any other wireless communication standards.

As illustrated in FIG. 1, the device 100 comprises a housing 101. There provided a plurality of ports 102 on the housing 101, for example, 16 ports as illustrated in FIG. 1. Each port 102 may be a small form-factor pluggable (SFP) port for receiving a pluggable module, such as an SFP module 104 or a pluggable FEM 103. As used herein, the FEMs 103-1, 103-2, and 103-3 are collectively referred to as FEMs 103, or individually referred to as FEM 103. As for pluggable FEM 103, the FEM may be implemented in the SFP module 104.

According to implementations of the present disclosure, the SFP port 102 may be designed for receiving an SFP module or receiving a pluggable FEM. The plurality of SFP ports 102 may be designed to receive a first number of SFP modules 104 and/or a second number of pluggable FEMs 103. It should be understood that the sum of the first number and the second number may be equal to or less than the number of the SFP ports 102.

For example, as illustrated in FIG. 1, the electronic device 100, for example, an access point, which is a 4×4 MIMO AP, there are provided 16 SFP ports 102 on the housing 101, and 12 ports among the 16 SFP ports are configured to receive the pluggable FEMs 103, for example, four FEMs 103-1 for 2.4G, four FEMs 103-2 for 5G, and four FEMs 103-3 for 6G, and 4 ports among the 16 SFP ports are configured to receive four SFP modules 104. In one example, each inserted module includes 20 pins, and accordingly, the SFP port includes 20 pins to communicate with the 20 pins of the inserted module, respectively. The pins of each module and each SFP port may be described hereinafter in detail. The SFP ports may be electrically connected to a main board 108, as illustrated in FIG. 1.

In some implementations, the SFP module 104 may store an identifier for indicating the type thereof, and the pluggable FEM 103 may also store an identifier for indicating the type thereof. For example, the SFP module 104 or the pluggable FEM 103 has a memory to store the identifier thereof. When the module 103 or 104 is inserted into the SFP port 102, the inter-integrated circuit (I2C) pins of the SFP ports communicate with the I2C pins of the module to acquire a signal for the identifier, and transmit the acquired signal for the identifier to a program implemented on an Electrically Erasable Programmable Read-Only Memory (EEPROM) on the main board 108. The I2C pins will be described hereinafter in detail. By receiving the signal for the identifier and performing this program, the type of the pluggable module may be identified to be an SFP module 104 or a pluggable FEM 103.

In some implementations, the SFP module 104 may be an SFP optical module, for example, a compact, hot-swappable optical module for telecom and data communication applications. The SFP optical module may be considered as an upgraded version of the Giga Bitrate Interface Converter (GBIC) optical module. SFPs connect the main boards of network devices (such as an access point or similar devices) to fiber optic or electrical cables, for example, fiber or cable, as illustrated in FIG. 1. SFP optical modules are expected to operate at data transfer rates of 5 gigabits per second (5 Gbps) or higher. SFP optical modules may be easily interchanged. Therefore, compared with traditional soldering modules, SFP optical modules may make the upgrade and maintenance of optical or optical networks more convenient. Due to its low cost, small size, and ability to connect to different fiber types, the SFP optical module may significantly save costs and thus is widely commercially available. In some implementations, the SFP module 104 may be an SFP copper module, which is an electrical port SFP module. The electrical port SFP module adopts the SFP packaging form and can support a maximum transmission distance of 100 m, in which RJ45, category 5 twisted pair is used as the transmission medium.

As illustrated in FIG. 1, the device 100 further comprises a main board 108, for example, an integrated circuit or a chip provided inside the housing 101, and the main board 108 may comprise a microcontroller or a central processing unit (CPU). The main board 108 is provided with a multiplex unit (MUX) 105. As illustrated in FIG. 1, the main board 108 is also provided with the first circuit unit 106 and a second circuit unit 107. The first circuit unit 106 may be, for example, a radio frequency integrated circuit on the main board 108 (for example, aa radio frequency integrated circuit (RFIC) on CPU), which is configured to receive signals from the FEM and transmit signals to the FEM. The second circuit unit 107 may be, for example, a fiber control module on the main board 108, specifically on the CPU, which is configured to communicate with an SFP module (for example, an SFP fiber module) so as to receive signals from a fiber and transmit signals to the fiber. It should be noted that when the SFP module 104 is another type of SFP module, such as the SFP copper module, the signal communicated between the second circuit unit 107 and the SFP module 104 may be different from the signal transmitted to/from the fiber.

As illustrated in FIG. 1, the first circuit unit 106 and the second circuit unit 107 are both electrically connected to the multiplex unit 105. As illustrated in FIG. 1, the pins provided in each SFP port 102 are also electrically connected to the multiplex unit 105. The MUX 105 may be notified about the type of the inserted module by the CPU (not shown) on the main board 108, and the MUX 105 can be configured based on the identified type of the inserted module. For example, if the module plugged inside a certain SFP port is a pluggable FEM 103, as illustrated in FIG. 1, the multiplex unit 105 may be configured to enable communications between the pluggable FEM 103 and the first circuit unit 106. Further, if the module plugged inside a certain SFP port is an SFP module 104, as illustrated in FIG. 1, the multiplex unit 105 may enable communications between the SFP module 104 and the second circuit unit 107.

As illustrated in FIG. 1, each pluggable FEM 103 is provided with an antenna 109, and the antenna 109 is provided on the casing of pluggable FEM 103 and disposed far away from the housing 101, which is far away from the SFP port 102. For example, the antenna 109 may be screwed on the casing of the pluggable FEM 103. Therefore, as compared to the case where the FEM is provided inside the housing 101 and provided on the main board 108, there is no need to provide a specific cable to connect the antenna outside the housing with the FEM inside the housing, thereby making the installation of the antenna more convenient.

It should be understood by the person skilled in the art that the shape of the housing, the number and shape of the SFP ports or modules shown in FIG. 1 are only exemplary and are not intended to limit the protection scope of the present disclosure in any way.

In the electronic device (such as an AP) of the present disclosure, the electronic device includes the housing 101, and several SFP ports 102 for receiving pluggable modules are arranged on the housing. Some of these SFP ports may be used to receive SFP modules, while others may be used to receive pluggable FEMs in which the functionality of FEM is implemented. The main board 108 is arranged inside the housing 101, and a circuit unit 107 for communicating with the SFP modules and another circuit unit 106 for communicating with the pluggable FEMs are arranged on the main board 108. The main board 108 may identify whether the inserted module is an SFP module or a pluggable FEM. The main board 108 is also provided with the multiplex unit 105 if it is recognized that the module inserted into the SFP port is an SFP module 104, the MUX 105 may be configured to enable the SFP module 104 to communicate with the second circuit unit 107, for example, a fiber control module on the main board 108. If it is recognized that the module inserted into the SFP port is a pluggable FEM 103, the MUX 105 may be configured to enable the pluggable FEM 103 to communicate with the first circuit unit 106, for example, the RFIC for FEM on the main board 108.

In the implementations of the present disclosure, the pluggable FEM is realized by the SFP module outside the housing of the electronic device. As a pluggable module outside the housing of the electronic device, the pluggable FEM may be easily installed on the electronic device, and therefore the pluggable FEM implemented inside the SFP module can be more flexible, replaceable, and modular. Further, by providing the MUX 105 on the main board 108, the typical fiber signal transmitting and control function, along with the FEM function, can be achieved. Therefore, the SFP port can be used to receive several types of pluggable modules, for example, an SFP fiber module, the pluggable FEM, and also an SFP copper module, thereby extending the usage of the SFP port.

Since the plurality of pluggable FEMs is provided outside the housing of the electronic device, there is enough room to provide these pluggable FEMs. The distance between two pluggable FEMs for the same frequency bands can be provided to be long enough, resulting in better interference isolation, better radio frequency performance, and higher receiving sensitivity.

In addition, an SFP module typically comprises two levels of shielding, for example, SFP module mechanical shielding (for example, a metal casing of the SFP module) and Electro-Magnetic Interference (EMI) shielding cage provided as an external cage for surrounding the body of the SFP module. Since the FEM is implemented inside the SFP module, due to the good shielding capacity of the SFP module itself, it is possible to provide better shielding for the pluggable FEM 103 compared to traditional FEM provided inside the housing 101 of the electronic device 100, thereby resulting in further better radio frequency performance and higher receiving sensitivity.

The standard circuitry area of the SFP module may be about 23 mm*13 mm, and the area for a FEM, for example, the FEM85747, is about 3.3 mm*5.3 mm, so there is enough space on the SFP module to provide the FEM. Compared to providing the FEM on the main board 108, the pluggable FEM, according to the present disclosure, will be much easier to be designed and installed.

Traditionally, if the FEM is mounted on the main board 108, in the event that the FEM is failed, the whole main board 108 has to be replaced or maintained. However, in implementations of the present disclosure, since the FEM function is implemented in an SFP module 104, a pluggable FEM 103 is realized outside the housing 101 so that the pluggable FEM 103 can be easily replaced and installed. That is to say, a plurality of pluggable FEMs 103 can be implemented outside the housing 101 of the device 100, and thus it is possible to make the installation and replacement of the FEM more convenient.

Traditionally, when the FEM is installed inside the housing 101 and the antenna is installed on a reflecting board outside the housing, a radio frequency cable has to be connected between the FEM inside the housing 101 and the antenna outside the housing, and therefore the cables routing design and assembly will be complicated. In implementations of the present disclosure, since the FEM is implemented in an SFP module and can be provided outside the housing 101 and the antenna 109 can be directly screwed onto the pluggable FEM (i.e., a modified SFP module in which the FEM is implemented) so as to be connected to the FEM provided therein, there is no need to provide any radio frequency connection cable to connect the main board 108 inside the housing 101 to the antennas 109, and it may make the installation of the antenna more convenient.

Further, FEM power consumption is less than the 10G SFP fiber module, and the 10G SFP fiber module has a mature thermal dissipation solution. By means of the good thermal dissipation of the SFP module, the heat dissipation of the FEM implemented in the SFP module will be improved, and accordingly, the service life of the pluggable FEM 103 will be increased.

Hereinafter, one example circuit of a FEM will be described with reference to FIG. 2. The FEM hardware circuit in the pluggable FEM achieves the transmission amplification of the RF signal and accepts the amplification, and acts in a role of power detection, controlling, and switching. The FEM comprises a transceiver for transmitting and receiving signals with a frequency band. The different frequency bands comprise 2.4G, 5G, and 6G. That is to say, for Wi-Fi products, the FEM may be divided into 2.4G FEM, 5G FEM, and 6G FEM, which are applied to 2.4G, 5G, and 6G frequency bands, respectively. Each FEM may be provided with a Power Amplifier (PA), a Low Noise Amplifier (LNA), a switch, and Feedback Unit. The PA refers to an amplifier circuit that may amplify the power of the signal and then output high-power signals. The LNA is an amplifier with a very low noise coefficient and is generally used as a high-frequency or intermediate-frequency preamplifier for various radio receivers and an amplifier circuit for high-sensitivity electronic detection equipment. The switch may control the switching between TX and RX so that TX and RX share the antenna (for example, antenna 109 as illustrated in FIG. 1). The Feedback Unit may feedback a voltage, and the output power is generally linearly related to the feedback voltage value, and the output power may be calculated according to the feedback voltage value.

Figure 2:
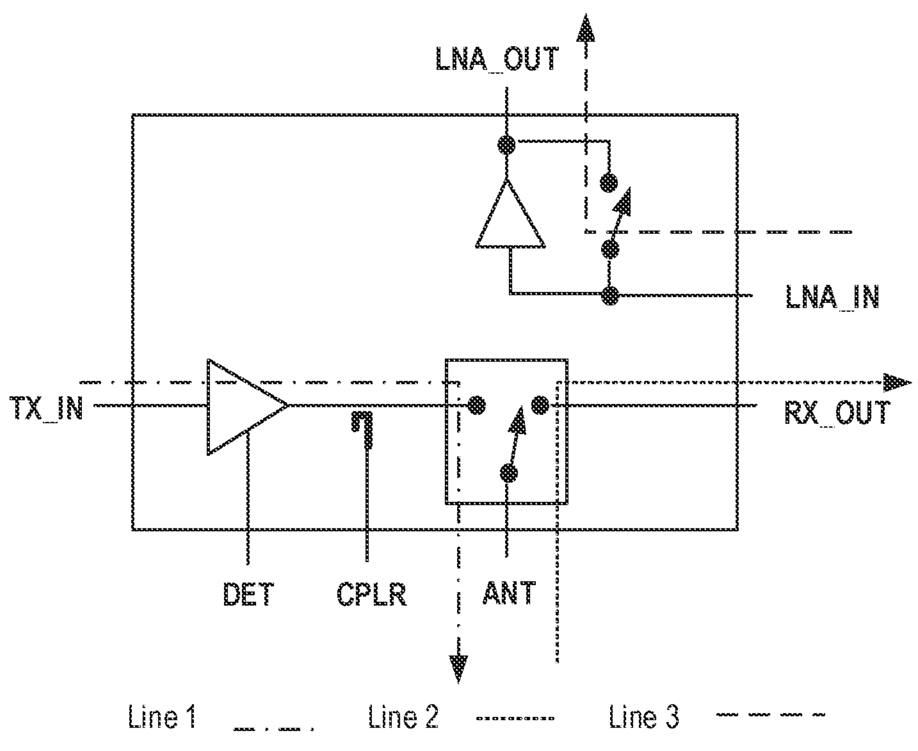
FIG. 2 illustrates an example circuit of a FEM in accordance with some example implementations of the present disclosure.

The signaling paths of a FEM are also illustrated in FIG. 2. The path denoted by line 1 indicates the TX path, in which the signal is transmitted by the Wi-Fi circuit (for example, a first circuit unit 106 on the CPU, as illustrated in FIG. 1) and passes through the PA (power amplification), the switch, and finally through the antenna. The path denoted by line 2 indicates the RX path, in which the antenna receives the wireless signal, and then the signal passes through the switch, and returns to the Wi-Fi circuit (for example, the first circuit unit 106 on the CPU). The path denoted by line 3 indicates the RX path, the difference between this RX path and the RX path denoted by solid line 2 is that this path further passes through the LNA (Low Noise Amplifier) before being given to the Wi-Fi circuit (for example, the first circuit unit 106 on the CPU).

Figure 3:
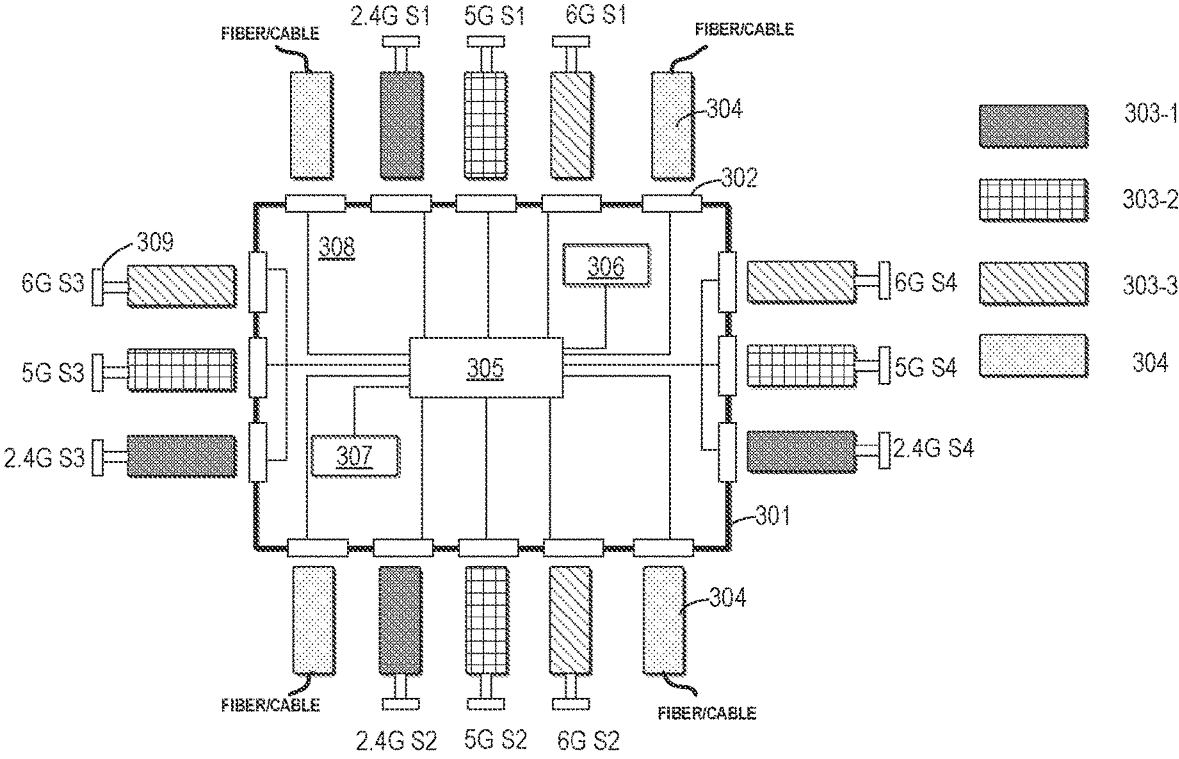
FIG. 3 illustrates an exemplary deployment of a plurality of pluggable FEMs on a housing of the electronic device in accordance with some example implementations of the present disclosure.

Hereinafter, an exemplary deployment of the pluggable FEMs on the housing of the electronic device in accordance with some example implementations of the present disclosure will be described with reference to FIG. 3. The housing 301, as illustrated in FIG. 3 may correspond to the housing 101, as illustrated in FIG. 1. The SFP port 302, as illustrated in FIG. 3 may correspond to the SFP port 102, as illustrated in FIG. 1. The pluggable FEMs 303-1, 303-2, and 303-3, as illustrated in FIG. 3 may correspond to the pluggable FEMs 103-1, 103-2, and 103-3, as illustrated in FIG. 1. The SFP module 304, as illustrated in FIG. 3 may correspond to the SFP module 304, as illustrated in FIG. 1. The multiplex unit 305, the first circuit unit 306, the second circuit unit 307, the main board 308, and the antenna 309 as illustrated in FIG. 3 may correspond to the multiplex unit 105, the first circuit unit 106, the second circuit unit 107, the main board 108, and the antenna 109, as illustrated in FIG. 1.

As illustrated in FIG. 3, the pluggable FEMs 103 of the same frequency band may be arranged on the SFP ports 102 far away from each other on the housing 101. In an implementation in which 16 SFP ports 302 are totally included, for example, a maximum of 12 pluggable FEMs 303 may be inserted into 12 SFP ports, and the remaining 4 SFP ports are used to receive SFP modules 304.

As illustrated in FIG. 3, two pluggable FEMs used as 2.4G S1 and 2.4G S2 or two pluggable FEMs used as 2.4G S3 and 2.4G S4 may be arranged in pair opposite to each other on the housing 301. Two pluggable FEMs used as 5G S1 and 5G S2, or two pluggable FEMs used as 5G S3 and 5G S4 may also be arranged in pair opposite to each other on the housing 301. Two pluggable FEMs used as 6G S1 and 6G S2, or two pluggable FEMs used as 6G S3 and 6G S4 may also be arranged in pair opposite to each other on the housing 301. Therefore, the distance between two pluggable FEMs for the same frequency bands is large enough, thereby resulting in better interference isolation, better radio frequency performance and higher receiving sensitivity. It should be noted that the shape of the housing 301 shown in FIG. 3 is just illustrative, and it may be other shapes, and two pluggable FEMs for the same frequency band should be provided far from each other according to the shape of the housing.

Hereinafter, a method 400 of operating an electronic device comprising a pluggable FEM implemented in an SFP module in accordance with some example implementations of the present disclosure will be described with reference to FIG. 400. The SFP port is typically designed to receive an SFP fiber module or an SFP copper module. In implementations of the present disclosure, it may take an SFP fiber module as an example of the inserted SFP module, and the circuit on the main board for communicating with the SFP fiber may be a fiber control module. Since the pluggable FEM is implemented in an SFP module, the pluggable FEM has the same connectors or pins and shapes as those of the SFP module and may be adapted to be received in the SFP port.

Figure 4:
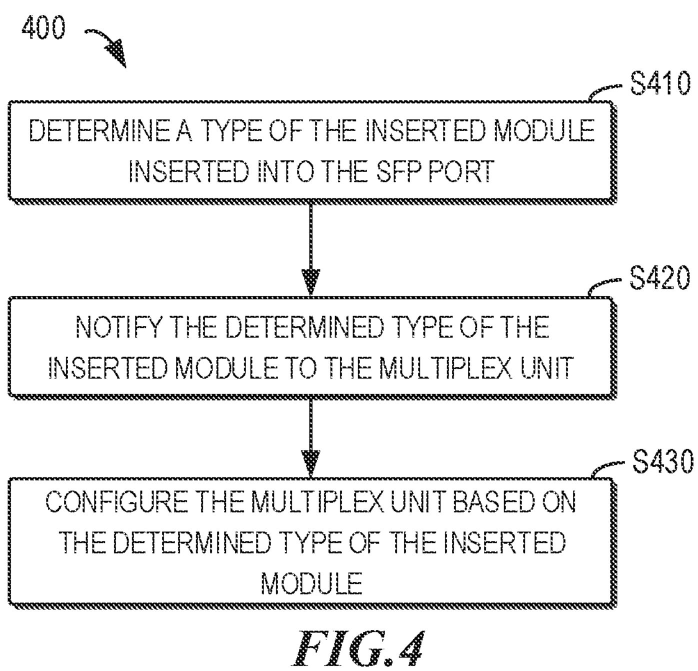
FIG. 4 illustrates a method of operating the electronic device comprising a pluggable FEM implemented in a small form-factor pluggable (SFP) module in accordance with some example implementations of the present disclosure.

As shown in FIG. 4, at S410, when a module is inserted into the SFP port, the type of inserted module is recognized or determined to be an SFP module or a pluggable FEM. The recognition may be achieved via the pins (such as I2C pins) of the SFP port and the corresponding pins of the inserted module. For example, the SFP module may store an identifier for indicating the type thereof, and the pluggable FEM may also store an identifier for indicating the type thereof. For example, the SFP module or the pluggable FEM has a memory to store the identifier thereof. When the module is inserted into an SFP port, the I2C pins of the module may be instructed to read the identifier from the memory and then communicate the identifier to the I2C pins of the SFP ports. The I2C pins of the SFP port may acquire different signals for different identifiers and transmit the acquired signal for the identifiers to an EEPROM on the main board. That is to say, for different types of modules inserted in the SFP port, the I2C pins of the SFP port may receive different signals. By receiving the specific signal for the specific identifier, the type of the pluggable module may be identified to be an SFP module or a pluggable FEM.

At S420, the determined type of the inserted module is transmitted or notified to the multiplex unit on the main board. For example, the multiplex unit may be notified of the determined type by the program implemented on an EEPROM of the main board. At S430, according to the identified type of the inserted module, the MUX is configured to enable communication between the inserted module and the first or second circuit unit. For example, if the identified type is a pluggable FEM, the multiplex unit may connect the pluggable FEM to the first circuit unit, for example, the RFIC on the CPU, and then the communication between the pluggable FEM and the first circuit unit may be enabled. If the identified type is an SFP module, the multiplex unit may connect the SFP module to the second circuit unit. For example, a fiber control module on the main board, specifically on the CPU, and then the communication between the SFP module and the second circuit unit may be enabled.

Figure 5A:
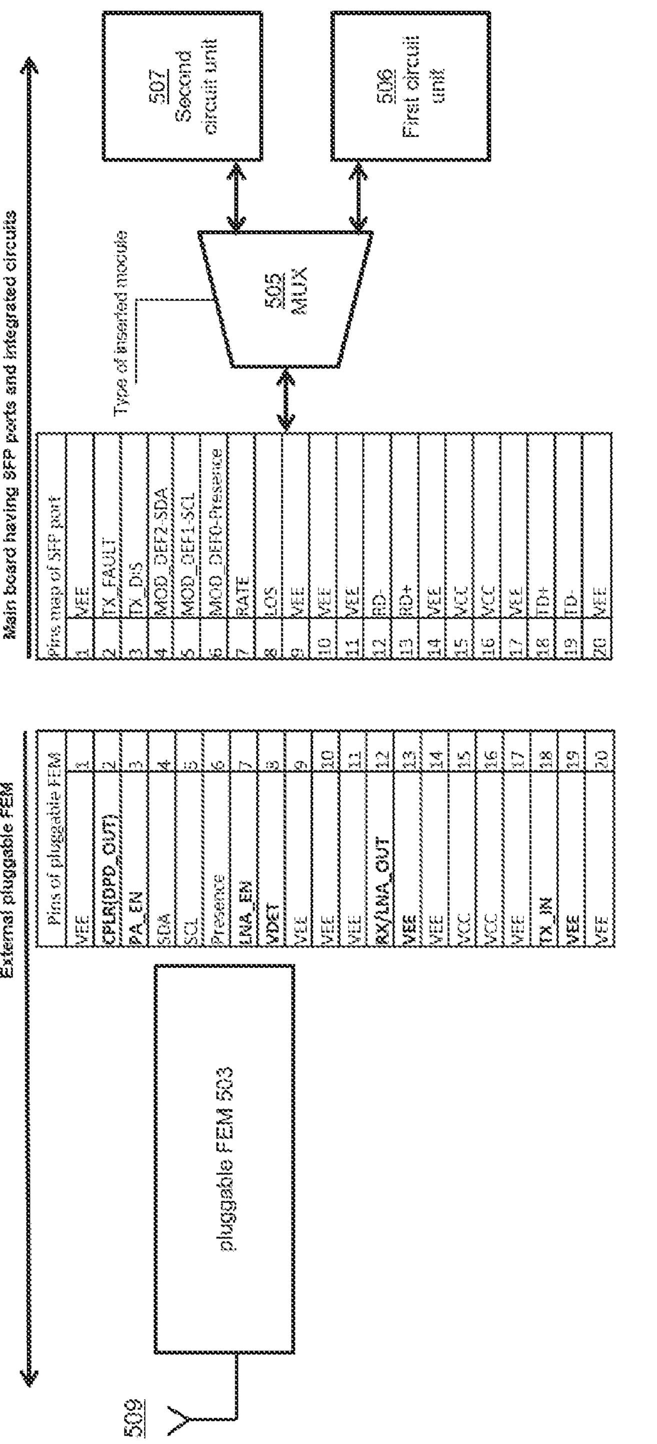
FIG. 5A illustrates an architecture diagram of an electronic device in accordance with some example implementations of the present disclosure.
Figure 5B:
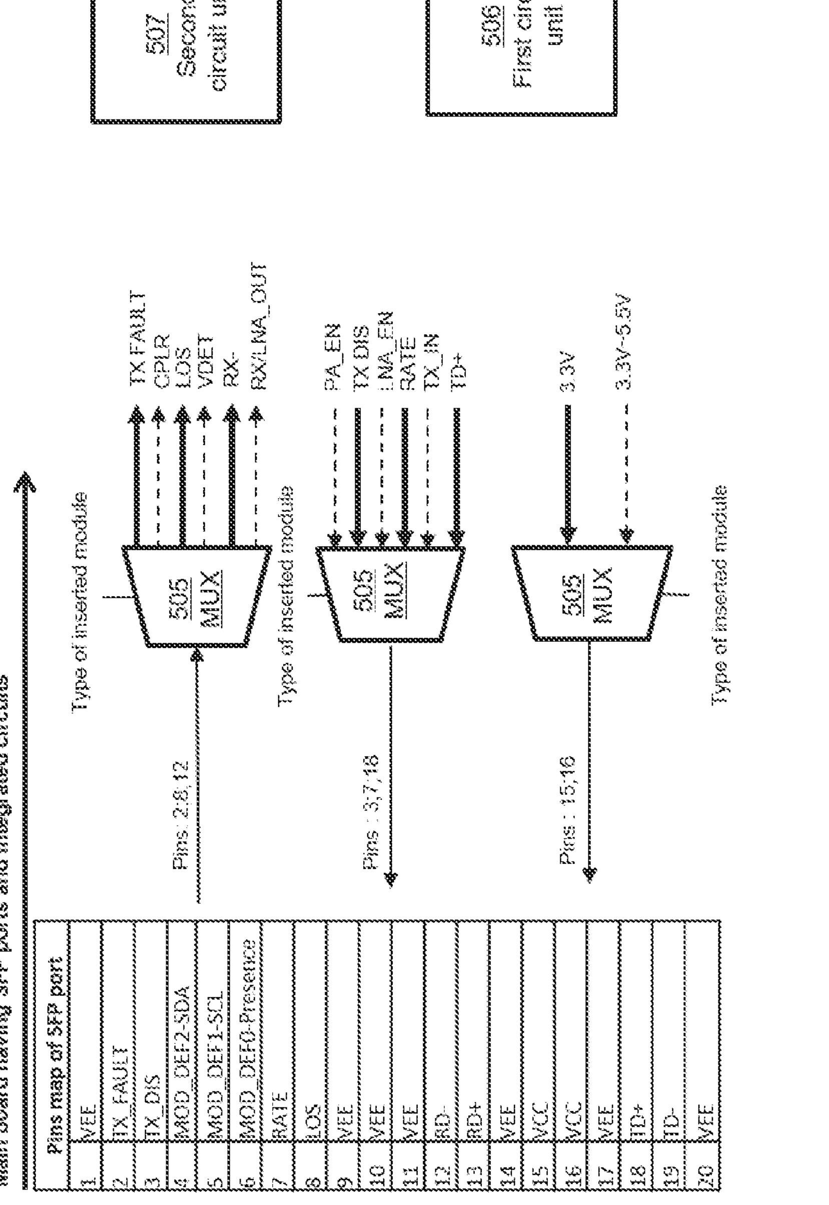
FIG. 5B illustrates a schematic diagram of signal flows of pins on a motherboard in accordance with some example implementations of the present disclosure.

FIG. 5A illustrates an architecture diagram of an electronic device in accordance with some example implementations of the present disclosure and FIG. 5B illustrates a schematic diagram of signal flows of pins on a motherboard in accordance with some example implementations of the present disclosure. The pluggable FEM 503, the multiplex unit 505, the first circuit unit 506, the second circuit unit 507, and the antenna 509 as illustrated in FIGS. 5A and 5B may correspond to the pluggable FEM 103, the multiplex unit 105, the first circuit unit 106, the second circuit unit 107, and the antenna 109.

Taking 85747-11 FEM as an example, this type of FEM includes at least the following pins: TX_IN, RX_OUT, LNA_OUT, LNA_IN, DET, CPLR, and ANT. It should be noted that the above-mentioned pins are just some examples of the pins included in the FEM, and the FEM may include other pins, rather than the above-mentioned pins, to achieve other functions.

An SFP module includes 20 pins, as illustrated in Table 1 below:

TABLE 1

| Pin map of SFP module 104 | | |
|---|---|---|
| Pin | Name | Function/description |
| 1 | VEE | grounded |
| 2 | TX_FAULT | Tx_Error report |
| 3 | TX_DIS | TX turn off |
| 4 | MOD_DEF2-SDA | Module identifying pin, data line for I2C communication |
| 5 | MOD_DEF1-SCL | Module identifying pin, clock line for I2C communication |
| 6 | MOD_DEF0-Presence | Module identifying pin grounded |
| 7 | RATE | rate selection |
| 8 | LOS | LOS alarm |
| 9 | VEE | grounded |
| 10 | VEE | grounded |
| 11 | VEE | grounded |
| 12 | RD− | Receiving part, data inversion output |
| 13 | RD+ | Receiving part, data output |
| 14 | VEE | grounded |
| 15 | VCC | power supply |
| 16 | VCC | power supply |
| 17 | VEE | grounded |
| 18 | TD+ | Transmitting part, data output |
| 19 | TD− | Transmitting part, data inversion input |
| 20 | VEE | grounded |

In order to communicate with the module, each SFP port of the housing for receiving one respective module may include 20 pins, and the 20 pins of the SFP port correspond to the 20 pins of the module so as to communicate with the module plugged therein.

In order to implement the FEM by the SFP module, some pins of the SFP module should be modified so as to form a pluggable FEM. The pins of the SFP module may be modified as illustrated in the following Table 2:

TABLE 2

| Pin map of pluggable FEM 103 | | |
|---|---|---|
| Pin | Name | Function/description |
| 1 | VEE | grounded |
| 2 | * CPLR (DPD_OUT) | DPD coupler output |
| 3 | * PA_EN | TX control pin, Power Amplification enabled |
| 4 | MOD_DEF2-SDA | Module identifying pin, data line for I2C communication |
| 5 | MOD_DEF1-SCL | Module identifying pin, clock line for I2C communication |
| 6 | MOD_DEF0-Presence | Module identifying pin |
| 7 | *LNA_EN | RX control pin, Low Noise Amplifier enabled |
| 8 | *VDET | Detector output |
| 9 | VEE | grounded |
| 10 | VEE | grounded |
| 11 | VEE | grounded |
| 12 | *RX/LNA_OUT | Switch RX output/LNA output |
| 13 | *VEE | grounded |
| 14 | VEE | grounded |
| 15 | VCC | power supply |
| 16 | VCC | power supply |
| 17 | VEE | grounded |
| 18 | *TX_IN | Transmit input |
| 19 | *VEE | grounded |
| 20 | VEE | grounded |

As illustrated in the above table, the pins 2 and 3 of the SFP module are modified into the CPLT and PA_EN pins of the FEM; the pins 7 and 8 of the SFP module are modified into the LNA_EN and VDET pins of the FEM; the pins 12 and 13 of the SFP module are modified into the RX/LNA_OUT and VEE pins of the FEM; and the pins 18 and 19 of the SFP module are modified into the TX_IN and VEE pins of the FEM, a pluggable FEM is generated and configured.

As shown in Table 2 above, the pin 2 of the pluggable FEM is a pin for transmitting the output of a digital pre-distortion (DPD) coupler; the pin 3 of the pluggable FEM is a transmitting control pin and is configured to enable the power amplification function; the pin 7 of the pluggable FEM is a receiving control pin and configured to enable the low noise amplifier; the pin 8 of the pluggable FEM is a pin for transmitting the output of the power detector; the pin 12 of the pluggable FEM is a pin for switching between the RX output path and the LNA output path; the pin 13 of the pluggable FEM is a pin to be grounded; the pin 18 of the pluggable FEM is a transmission input pin; and the pin 19 of the pluggable FEM is a pin to be grounded. The remaining pins of the pluggable FEM may be the same as the SFP module. These 20 pins may be connected to the 20 pins of the SFP port when the pluggable FEM is inserted into a respective SFP port.

The pin 6 of the module and the pin 6 of the SFP port are communicated with each other and configured to detect the presence of a module inside the SFP port. In response to the presence of a module inside the SFP port, the pins 4 and 5 may be activated to receive signals from the inserted module. Then, through the communication between the pins (for example, pins 4 and 5, serial data line (SDA) and serial clock line (SCL)) of the inserted module and the pins of the SFP ports on the main board and further through the program executed on the main board (for example, EEPROM on the main board), it may identify whether the inserted module is an SFP module or a pluggable FEM. As illustrated in FIG. 5A, if the identified module is a pluggable FEM, the MUX 505 is configured to enable the communication between this inserted module and the first circuit unit 506, for example, an RFIC for FEM on the main board. As illustrated in FIG. 5A, if the identified module is an SFP module, the MUX 505 is configured to enable the communication between this inserted module and the second circuit unit 507, for example, a fiber control module on the main board.

As illustrated in FIG. 5B, the solid line arrows indicate the signal flow of the communications between the SFP module and the second circuit unit 507, for example, an optical fiber control circuit on the main board, and the dotted line arrows indicate the signal flow of the communication between the pluggable FEM and the first circuit unit 506 (for example, RFIC) on the main board.

As illustrated in FIG. 5B, pins 2, 8, and 12 of the SFP port are used to allow the signal flow from inserted module to the respective circuit unit 506 or 507 on the main board. When the inserted module is a pluggable FEM, as shown by the dotted line arrow, the signal from the pluggable FEM is communicated, via the pins 2, 8, and 12 of the SFP port and the multiplex unit 505, to the first circuit unit 506 (for example, RFIC) on the main board. When the inserted module is an SFP module, as shown by the solid arrow, the signal from the SFP module is communicated, via the pins 2, 8, and 12 of the SFP port and the multiplex unit 505, to the second circuit unit 507 for the SFP fiber control on the main board.

As illustrated in FIG. 5B, pins 3, 7, and 18 of the SFP port are used to allow the signal flow from the respective circuit unit 506 or 507 on the main board to the inserted module. When the inserted module is a pluggable FEM, as shown by the dotted line arrow, the signal from the first circuit unit 506 (for example, RFIC) is communicated, via the pins 3, 7, and 18 of the SFP port and the multiplex unit 505, to the pluggable FEM. When the inserted module is an SFP module, as shown by the solid arrow, the signal from the second circuit unit 507 for the SFP fiber control on the main board is communicated, via the pins 3, 7, and 18 of the SFP port and the multiplex unit 505, to the SFP module.

As illustrated in FIG. 5B, pins 15 and 16 represent power supply pins. The power supply voltage for the FEM is in the range of 3.3V to 5.5V, while the supply voltage for the SFP module is 3.3V. The power may be supplied from the main board to the inserted modules via the pins 15 or 16.

Certain features that are described in the context of separate implementations may also be implemented in combination in a single implementation. Conversely, various features that are described in the context of a single implementation may also be implemented in multiple implementations separately or in any suitable sub-combination.

In the foregoing Detailed Description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

What is claimed is:

1. An electronic device, comprising:

a housing comprising a plurality of small form-factor pluggable (SFP) ports for receiving a plurality of pluggable modules, the plurality of pluggable modules comprising at least one SFP module and at least one pluggable front end module (FEM);

a first circuit unit provided inside the housing;

a second circuit unit provided inside the housing; and a multiplex unit provided inside the housing and configured to enable communications between the pluggable FEM and the first circuit unit, and enable communications between the SFP module and the second circuit unit by communicating a first identifier via pins of the pluggable FEM module to a first SFP port receiving the pins of the pluggable FEM module, and communicating a second identifier via pins of the SFP module to a second SFP port receiving the pins of the SFP module.

2. The electronic device of claim 1, wherein the multiplex unit is connected between each of the plurality of SFP ports and the first and second circuit units, in a case that the pluggable FEM is inserted into the first SFP port of the plurality of SFP ports, the multiplex unit is configured to enable communications between the pluggable FEM and the first circuit unit via the first SFP port; and in a case that the SFP module is inserted into the second SFP port of the plurality of SFP ports, the multiplex unit is configured to enable communications between the SFP module and the second circuit unit via the second SFP port.

3. The electronic device of claim 1, wherein the SFP module stores the first identifier for identifying the SFP module, and the pluggable FEM stores the second identifier for identifying the pluggable FEM.

4. The electronic device of claim 1, wherein:

the SFP module comprises a first number of pins, and each of the plurality of SFP ports comprises the first number of pins, the pluggable FEM comprises a second number of pins, and the second number is less than or equal to the first number, and the pluggable FEM is implemented by integrating the second number of pins into a part of the first number of pins of the SFP module.

5. The electronic device of claim 1, wherein:

the first circuit unit is a radio frequency integrated circuit, and the second circuit unit is an optical fiber control module.

6. The electronic device of claim 1, further comprising an antenna provided on the pluggable FEM and arranged far away from an SFP port in which the pluggable FEM is inserted.

7. The electronic device of claim 1, wherein the pluggable module comprises an electro-magnetic interference shielding cage configured to surround a body of the pluggable module.

8. The electronic device of claim 1, wherein the at least one pluggable FEM comprises a plurality of pluggable FEMs configured to transmit and receive signal in different frequency bands.

9. The electronic device of claim 8, wherein:

the different frequency bands comprise 2.4G, 5G, and 6G, and two pluggable FEMs for the same frequency band are disposed in two SFP ports arranged far away from each other.

10. The electronic device of claim 9, wherein the two SFP ports are disposed at two ends of a diameter of the housing.

11. The electronic device of claim 1, wherein:

the first circuit unit, the second circuit unit, and the multiplex unit are provided on a main board inside the housing.

* * * * *